(12) United States Patent
Phelan et al.

(10) Patent No.: US 11,346,103 B2
(45) Date of Patent: May 31, 2022

(54) SYSTEMS AND METHODS FOR A POWER-GENERATING THERMOGALVANIC BRICK

(71) Applicants: ARIZONA BOARD OF REGENTS ON BEHALF OF ARIZONA STATE UNIVERSITY, Tempe, AZ (US); KINGS COLLEGE LONDON, London (GB); UNIVERSITY OF NEW SOUTH WALES, Sydney (AU)

(72) Inventors: Patrick Phelan, Tempe, AZ (US); Leigh Aldous, London (GB); Robert Taylor, Sydney (AU); Benjamin Obeng, Tempe, AZ (US)

(73) Assignees: Arizona Board of Regents on Behalf of Arizona State University, Tempe, AZ (US); Kings College London, London (GB); Newsouth Innovations PTY Limited, Sydney (AU)

(*) Notice: Subject to any disclaimer, the term of this patent is extended or adjusted under 35 U.S.C. 154(b) by 0 days.

(21) Appl. No.: 17/286,311

(22) PCT Filed: Oct. 18, 2019

(86) PCT No.: PCT/US2019/057071
§ 371 (c)(1),
(2) Date: Apr. 16, 2021

(87) PCT Pub. No.: WO2020/082028
PCT Pub. Date: Apr. 23, 2020

(65) Prior Publication Data
US 2021/0310244 A1    Oct. 7, 2021

Related U.S. Application Data

(60) Provisional application No. 62/747,595, filed on Oct. 18, 2018.

(51) Int. Cl.
*E04C 1/39*    (2006.01)
*H01G 9/20*   (2006.01)
(Continued)

(52) U.S. Cl.
CPC ............. *E04C 1/39* (2013.01); *H01G 9/2004* (2013.01); *H01G 9/21* (2013.01); *H01L 35/32* (2013.01)

(58) Field of Classification Search
CPC .................................. H01G 9/21; H01G 9/22
See application file for complete search history.

(56) References Cited

U.S. PATENT DOCUMENTS 255,885 A    4/1882  Patterson
641,214 A    1/1900  Matthias
(Continued)

FOREIGN PATENT DOCUMENTS

| WO | WO-2009030236 A2 * | 3/2009 | ............ H01L 35/00 |
| WO | WO-2012140856 A1 * | 10/2012 | ............ H01M 14/00 |
| WO | 2017092633 A1 | 6/2017 | |

OTHER PUBLICATIONS

Machine translation of WO2012/140856A1 (Year: 2012).*
(Continued)

*Primary Examiner* — Eric R Smith
(74) *Attorney, Agent, or Firm* — Polsinelli PC

(57) ABSTRACT

Various embodiments of systems and methods for a thermogalvanic brick are disclosed.

8 Claims, 19 Drawing Sheets

(51) Int. Cl.
*H01G 9/21* (2006.01)
*H01L 35/32* (2006.01)

(56) References Cited

U.S. PATENT DOCUMENTS

| | | | |
|---|---|---|---|
| 2,310,354 A | | 2/1943 | Deysher |
| 2,882,329 A | * | 4/1959 | Liebhafsky ............... H01G 9/21 429/11 |
| 4,376,155 A | | 3/1983 | Peck |
| 4,734,143 A | * | 3/1988 | Meoni ................. B29C 33/0016 156/102 |
| 10,162,394 B2 | | 12/2018 | Wu et al. |
| 2006/0219283 A1 | * | 10/2006 | Chang .................... H01L 35/30 136/205 |
| 2015/0050543 A1 | | 2/2015 | Christensen et al. |
| 2016/0190537 A1 | * | 6/2016 | Park ................... H01M 50/446 429/144 |
| 2017/0149083 A1 | * | 5/2017 | Duoss .................... H01G 11/52 |
| 2018/0375007 A1 | * | 12/2018 | Jin ............................ E04C 1/39 |
| 2019/0309998 A1 | | 10/2019 | Alelyani et al. |

OTHER PUBLICATIONS

International Search Report and Written Opinion issued in corresponding Application No. PCT/US2019/057071 dated Jan. 15, 2020, 7 pages.

Lee, Experimental Measurement of the Power Output of a Cu/Cu+ Thermogalvanic Brick, Arizona State University Digital Repository, Dec. 2018.

Gunawan, et al., Liquid Thermoelectrics: Review of Recent and Limited New Data of Thermogalvanic Cell Experiments, Nanoscale and Microscale Thermophysical Engineering 17, pp. 304-323, 2013.

Gunawan, et al., The amplifying effect of natural convection on power generation of thermogalvanic cells, International Journal of Heat and Mass Transfer 78, pp. 423-434, 2014.

Li, et al., 2017, Techno-economic analysis of a concentrating solar collector with built-in shell-and-tube latent heat thermal energy storage, Energy 121, pp. 220-237, 2017.

Maimani, et al., Achieving pseudo 'n-type p-type' in-series and parallel liquid thermoelectrics using all-iron thermoelectrochemical cells with opposite Seebeck coefficients, Electrochemistry Communications 72, pp. 181-185, 2016.

TEG Power Brick in solar application—Thermoelectric generator, May 12, 2010, https://www.youtube.com/watch?v=X7glSP5xGKY.

Thermoelectric Generator Brick Demo 2015, Apr. 7, 2015, https://www.youtube.com/watch?v=IAQd7nA6UBA.

Thermoelectric Generator TEG Power Bric, Oct. 5, 2009, https://www.youtube.com/watch?v=dMD4GlzLPzw.

Wu, et al., Thermoelectrochemistry using conventional and novel gelled electrolytes in heat-to-current thermocells, Electrochimica Acta, vol. 225, pp. 482-492. DOI: 10.1016/j.electacta.2016.12.152, 2017.

* cited by examiner

Background measurement of brick (1 hour sitting in the lab; no heating or cooling)

Brick filled with air (5 min no heating; 25 min heating; 15 min no heating)

Brick filled with water (5 min no heating; 20 min heating; 5 min no heating)

Brick filled with gel (5 min no heating; 20 min heating; 50 min no heating)

SYSTEMS AND METHODS FOR A POWER-GENERATING THERMOGALVANIC BRICK

CROSS REFERENCE TO RELATED APPLICATIONS

This is a PCT application that claims benefit to U.S. provisional patent application Ser. No. 62/747,595 filed on Oct. 18, 2018, which is herein incorporated by reference in its entirety.

This invention was made with government support under 1236571 awarded by National Science Foundation. The government has certain rights in the invention.

FIELD

The present disclosure generally relates to a thermogalvanic brick, and in particular to systems and methods for a thermogalvanic brick having the ability to convert temperature differences across the thermogalvanic brick into electricity using thermogalvanic electrochemistry.

BACKGROUND

To date, building components, such as bricks and concrete blocks, are passive devices that just provide structural support and thermal insulation, resulting in a significant temperature difference between the inside and outside of buildings. This temperature difference can be potentially exploited to generate useful electrical power, but should not compromise the thermal insulation properties of such building materials.

It is with these observations in mind, among others, that various aspects of the present disclosure were conceived and developed.

BRIEF DESCRIPTION OF THE DRAWINGS

Corresponding reference characters indicate corresponding elements among the view of the drawings. The headings used in the figures do not limit the scope of the claims.

DETAILED DESCRIPTION

Figure 1:
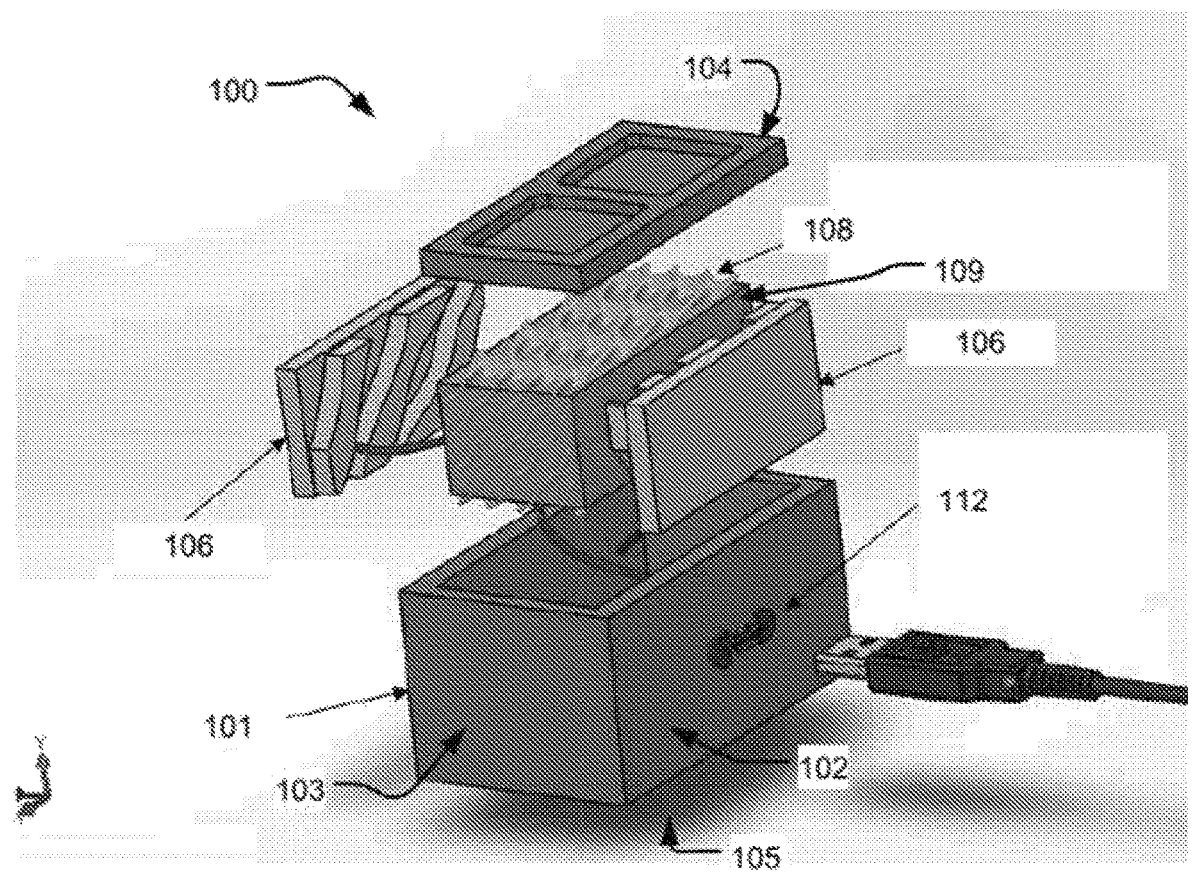
FIG. 1 is an exploded view showing the various components of a thermogalvanic power-generating brick.

The interiors of buildings are typically held at a nominally constant, comfortable temperature relative to the exterior temperature. In cooler climates, the interior should be warmer; in hotter climates, shading and ventilation should keep the interior cooler. Buildings account for approximately 40% of all energy consumed, and are characterized by an ever-increasing number of embedded, wireless electronic devices that require periodic charging. Thermogalvanic cells convert temperature differences directly into electricity, using basic chemistry and no mechanical parts to do so. The present systems and methods disclosed herein incorporate a thermogalvanic cell into a building element, such as a brick, while at the same time improving (or at least not compromising) the thermal resistance of the element. These thermogalvanic bricks will thus transform "smart" building structures by enabling them to generate electric power.

Temperature differences between the inside and outside of buildings occur because of both natural and man-made causes. Most buildings in the USA and other developed countries rely on air conditioning and space heating to maintain a comfortable environment. The thermogalvanic power-generating bricks as disclosed herein convert that artificially maintained temperature difference into useful power, while maintaining or improving the thermal resistance of the building envelope. These thermogalvanic bricks, in fact, exploit the natural thermal energy storage capability of buildings, in that the outside/inside temperature difference can linger even after the air conditioning and/or heating system has been turned off. In summertime, attic temperatures in houses can reach extreme levels; the thermogalvanic power-generating bricks can be placed to capitalize on the resulting large temperature difference between the occupied space and the attic. In developing countries that don't rely on artificial heating or cooling of buildings, massive building components such as masonry walls still yield appreciable inside/outside temperature differences that can be exploited to generate much-needed electric power at all times of the day or night. Referring to the drawings, embodiments of a thermogalvanic brick are illustrated and generally indicated as 100 in FIGS. 1-20C.

Figure 2:
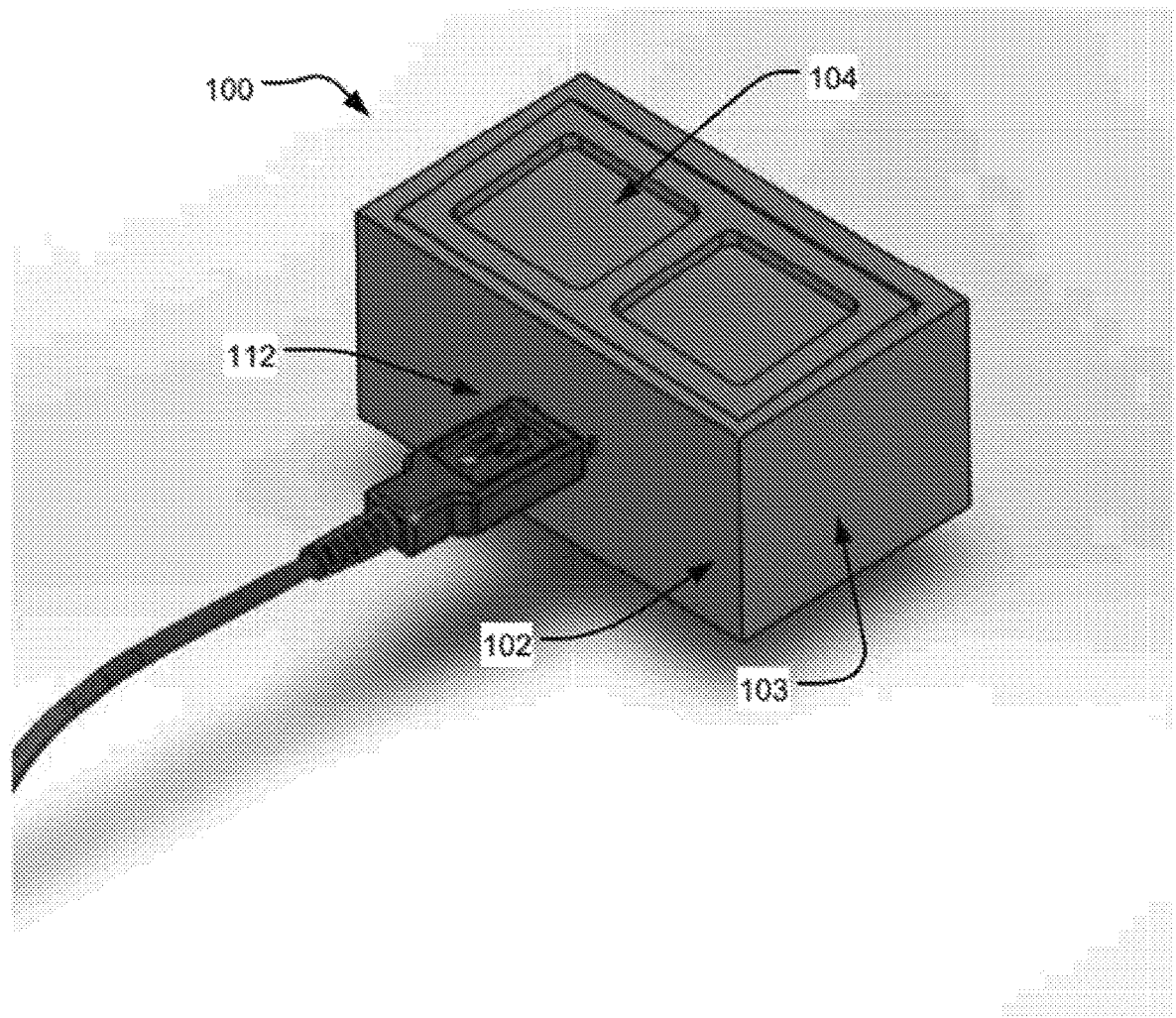
FIG. 2 is a perspective view of the assembled thermogalvanic power-generating brick of FIG. 1.

The thermogalvanic brick 100 as shown in FIGS. 1-2 comprises a thermogalvanic cell 107 disposed within an outer casing 101. As disclosed herein, in order to generate electric power, the thermogalvanic cell 107 requires an electrolyte 109 (embodied in some embodiments of the thermogalvanic brick 100 as a gelled water electrolyte 109) in contact with two conducting electrodes 106 that are maintained at different temperatures. Therefore, the thermogalvanic brick 100 needs to be in thermal contact with both the outer and inner surface temperatures of a building. The thermogalvanic brick 100 further comprises a three-dimensional interior structure 108 defining a lattice configuration and in some embodiments a Triply Minimal Periodic Surface (TPMS) configuration (shown in FIGS. 15-16) to improve physical strength, power conversion performance, and thermal insulation of the thermogalvanic brick 100. In addition, electricity generated by the thermogalvanic brick is exported through an outlet 112.

Figure 3:
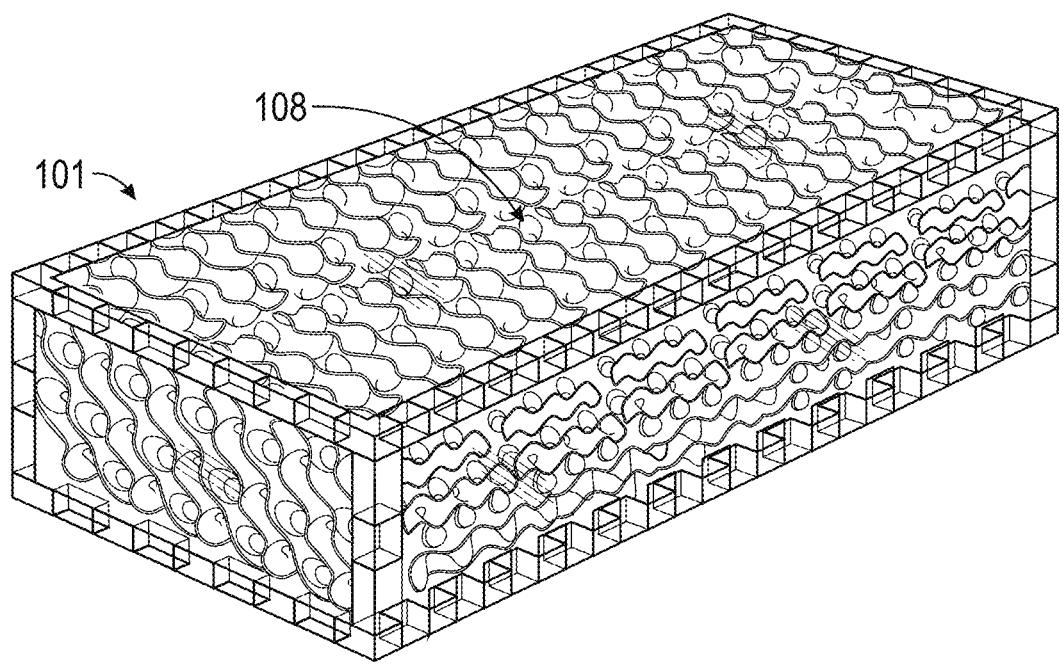
FIG. 3 is an image of a nonfunctional prototype embodiment having a clear acrylic plastic frame and an ABS plastic three dimensional Schwarz D geometry for structural strength, absent of thermogalvanic cell hardware or electrolyte.
Figure 4:
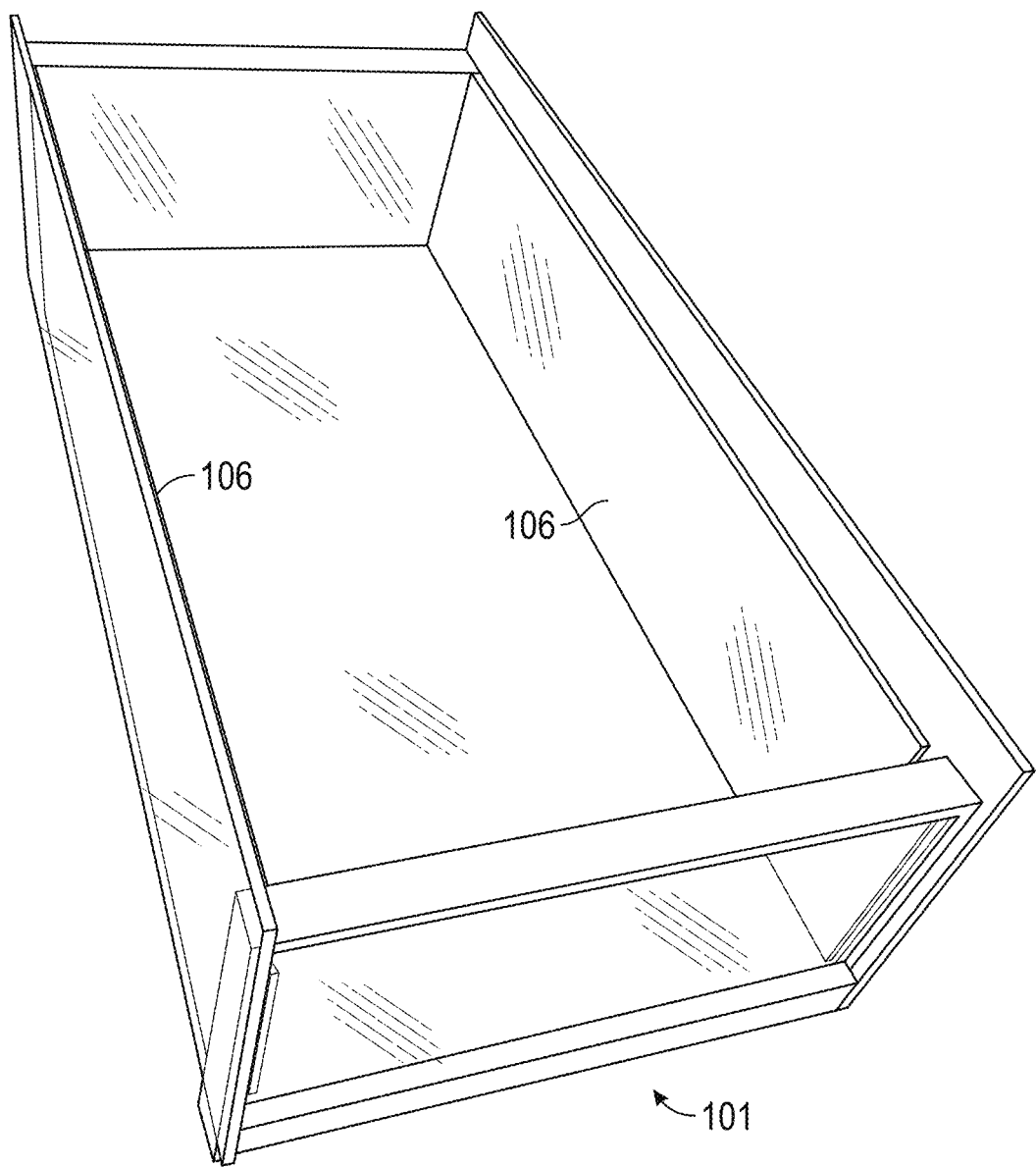
FIG. 4 is an image of the outer casing for a nonfunctioning prototype embodiment of a thermogalvanic brick having electrodes, absent of electrolyte or an internal structure.
Figure 5:
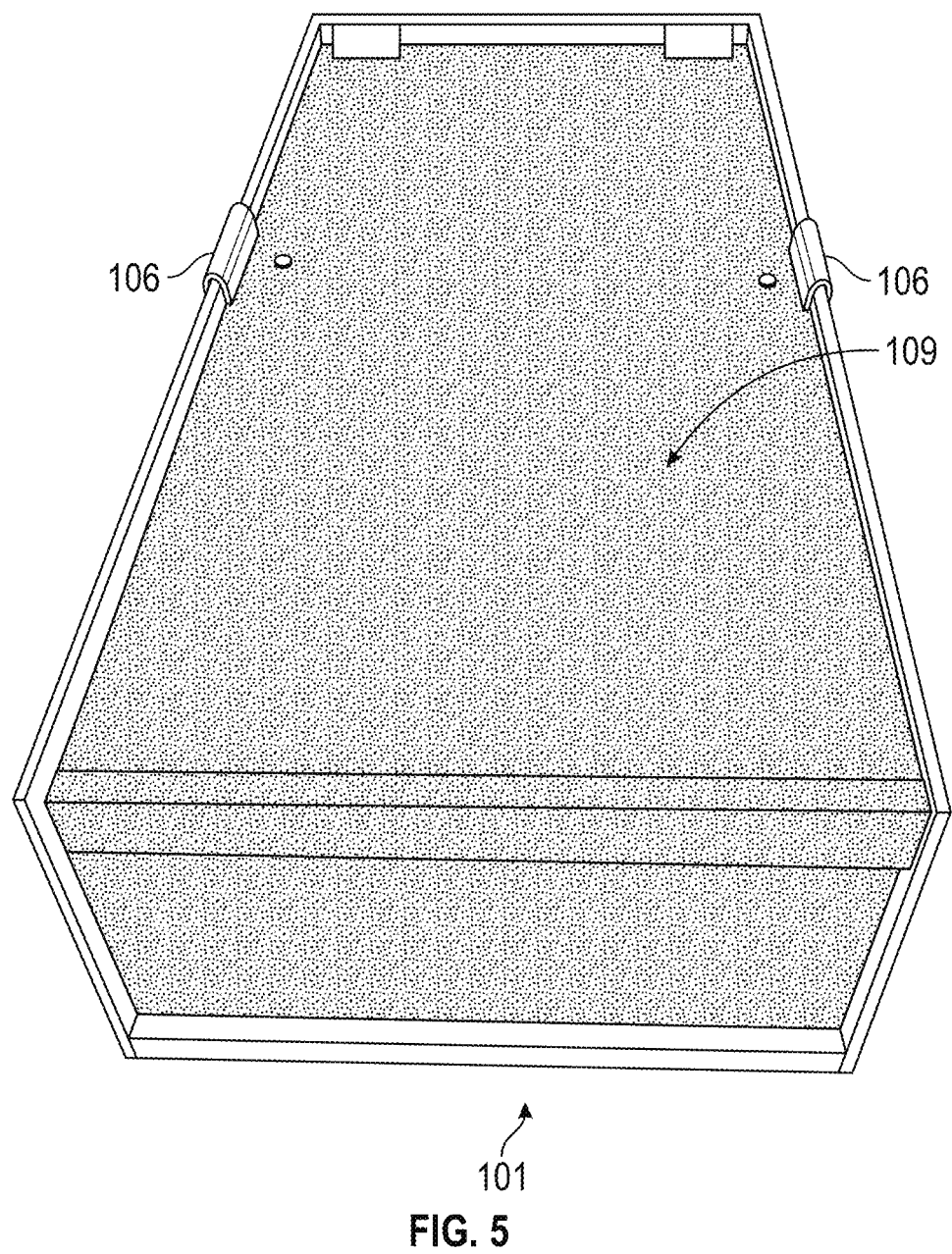
FIG. 5 is an image of a nonfunctional prototype embodiment of a thermogalvanic brick filled with electrolyte gel absent of the internal structure.

An initial nonfunctioning brick 100 prototype with a clear acrylic outer casing 101 for visibility, and a yellow Schwarz D interior structure 108 made from inexpensive ABS (Acrylonitrile Butadiene Styrene) plastic, is shown in FIG. 3. FIG. 4 shows an outer casing 101 of one embodiment of the thermogalvanic brick 100 and FIG. 5 shows a prototype of the thermogalvanic brick 100 having the gelled electrolyte 109 disposed within the outer casing 101 shown in FIG. 4. Note that in FIG. 4 and FIG. 5 only graphite electrodes 106 are employed, within an all-plastic assembly, and thus metal has not been employed in this embodiment.

The thermogalvanic brick 100, or more probably a plurality of thermogalvanic bricks 100, can be positioned on any wall of a building, on the floor, the roof, or on the ceiling—wherever there is a temperature difference between the inside and outside. At the same time, the thermal insulation value (i.e., the "R" value) of the thermogalvanic brick 100 must not be less than that of the building component that it is replacing. Finally, the thermogalvanic brick 100 as disclosed herein must have at least the same structural integrity as an ordinary brick, that is, it must meet applicable standard strength guidelines for bricks used in construction.

In some embodiments, the thermogalvanic brick 100 has thermal insulation and mechanical properties like that of a conventional brick, but also has the added ability of converting temperature differences across the thermogalvanic brick 100 into electricity using thermogalvanic electrochemistry. As discussed above, much of the interior of the thermogalvanic brick 100 is filled with the gelled water electrolyte 109. The gelled water electrolyte 109 includes a redox active compound dissolved within: ferricyanide and ferrocyanide are key examples. The gelled electrolyte 109 fills the primary roles of (i) providing insulation, and (ii) allowing thermogalvanic electrochemistry to occur. In addition, the gelled electrolyte 109 also fills the minor role of (iii) providing structural integrity to the thermogalvanic brick 100.

In some embodiments as discussed above, the interior structure 108 of the thermogalvanic brick 100 comprises a lattice or Triply Periodic Minimal Surface (TPMS) structure. A key example of this is a Schwarz-D plastic structure. The interior structure 108 provides most of the structural integrity and thermal insulation of the thermogalvanic brick 100. In other embodiments, the interior structure 108 of the thermogalvanic brick 100 may be comprised of a general plastic frame.

In some embodiments, two sides 102 of the housing 101 of the thermogalvanic brick 100 may both act as metal electrodes 106 such that one embodiment of the design is a thin sheet of aluminum with the interior coated with a layer of graphite paint. This serves the primary roles of (i) acting as two electrodes 106 allowing thermogalvanic electrochemistry to occur, and (ii) providing a thermal interface such that their temperature reflects the interior and exterior temperature. In some embodiments, the other four faces 103, 104, and 105 of the thermogalvanic brick 100 form the remainder of the housing 101. The housing 101 may form a water-tight seal such that no electrolyte 109 evaporates or leaks, nor can foreign substances enter the housing 101.

One aspect of the thermogalvanic brick 100 is the control of the solar irradiation upon the exterior electrode 106 to exert some control over the temperature. When the exterior is hotter than the interior of the thermogalvanic brick 100, additional solar irradiation will generate a temperature difference of up to 30° C. greater than a shaded thermogalvanic brick 100, and therefore more electricity. However, the thermogalvanic brick 100 must be installed carefully to ensure the thermal envelope of the building is maintained. Since the power directly expresses the temperature difference, and the temperature of each electrode 106 can also be individually determined, this effect can be intelligently tailored as needed (black for additional heating, shading used to reduce it, etc.).

Finally, the nature of the thermogalvanic brick 100 also results in new potential methods of construction. For example, a rapidly prefabricated and temporary accommodation in a humanitarian disaster could be constructed using magnets (not shown) incorporated in the thermogalvanic bricks 100. Conversely, solvent welding is a common process used to combine plastic sheets that takes seconds to achieve; it is how the prototypes of the thermogalvanic brick 100 have been constructed. If multiple thermogalvanic bricks 100 are solvent-welded together, such bricks will form an extremely robust, waterproof, insulated wall.

The initial thermogalvanic brick 100 prototypes are constructed largely from plastic, in part through additive manufacturing ("3D printing"). FIG. 1 shows an exploded view of one embodiment of the thermogalvanic brick 100. Structural strength is provided by an interior lattice or TPMS structure 108, made from plastic that is lightweight and uses relatively little solid material. The interior structure 108 is immersed in the gelled electrolyte 109, and two conducting electrodes 106 are placed on either side of the interior structure 108 and in contact with the electrolyte 109. The interior structure 108, electrolyte 109, and electrodes 106 are contained within the outer casing 101. Because the interior structure 108 provides structural support, the outer casing 101 does not need to be load-bearing. The electrodes 106, which in some embodiments are made partially of aluminum and carbon, are in good thermal contact with the outer and inner temperatures, respectively. In some embodiments, the outlet 112 for the generated electricity may be in the form of a USB port or some other kind of socket.

The complete, closed conceptual thermogalvanic brick 100 is shown in FIG. 2. The dimensions of the thermogalvanic brick 100 are chosen to be compatible with the UK standard, but are not limited to those dimensions. It is anticipated that each thermogalvanic brick 100 will yield as much as 1 mW of power under ordinary temperature conditions, thereby making it necessary in most cases to couple the electric output of a number of bricks 100 to provide useful amounts of power.

Figure 6:
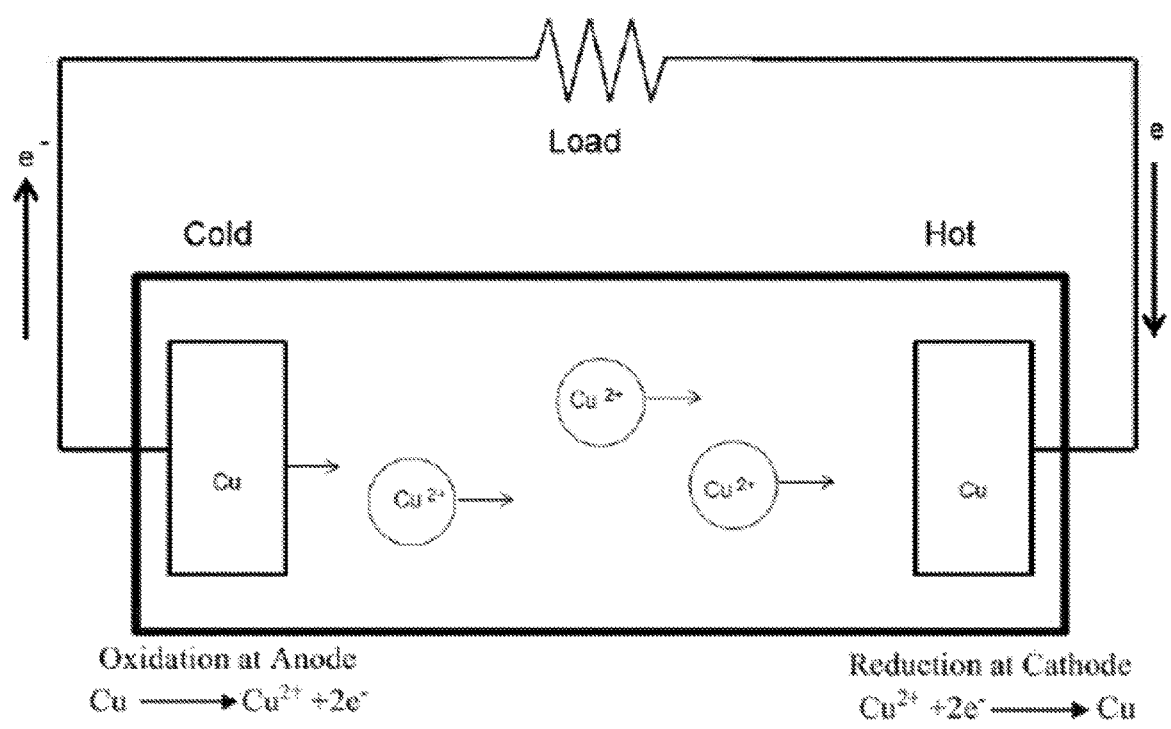
FIG. 6 shows a diagram of a thermogalvanic cell including demonstration of a redox reaction to generate electricity from heat differentials.

A thermogalvanic cell 107 is defined as a galvanic cell with a non-uniform temperature, where energy is generated using temperature differentials. In practice, such cell will consist of two metallic electrodes 106, not necessarily reversible or chemically identical, immersed in electrolyte 109, which may or may not be homogenous in composition, and in which selectively permeable membranes in the form of an interior structure 108 might be interposed. As shown in FIG. 6, the non-uniform temperature generates a potential difference which is directly proportional to the entropy change of the redox reaction. This potential difference causes ions to move from the cold electrode 106 which serves as the anode to the hot electrode 106 which is the cathode when a load is connected.

Oxidation at Anode (Cold electrode): $Cu \rightarrow Cu^{2+}+2e^-$ (1)

Reduction at Cathode (Hot electrode): $Cu^{2+}+2e^- \rightarrow Cu$ (2)

The electrochemical performance of the thermogalvanic cell greatly depends on a property known as the Seebeck coefficient. This property relates the temperature difference to the electrode potential of thermogalvanic cell 107 and has a quadratic effect on the cell's performance. It is said that in thermogalvanic cells 107, this property is three to four times greater than that of solid thermoelectrics. However, the internal resistance of the thermogalvanic 107 cell is high; a major hindrance to its overall performance.

Another feature that affects the performance of the thermogalvanic cell 107 is the conduction of heat across its terminals or electrodes. An ideal thermogalvanic cell 107 has a high electrical conductivity ($\sigma$) but low thermal conductivity (K). However, both properties are directly related and hence, there is a significant tradeoff between the two parameters since a typical material of high electrical conductivity will also have high thermal conductivity. An ideal separator is porous and hence, allow ionic transport, yet highly thermal resistive in order to maintain a large temperature gradient between the electrodes.

The thermogalvanic brick 100 is a building material that converts the temperature difference across building surfaces into useful energy using the principle of Seebeck effect; recovering waste heat and converting the waste heat into electricity. The present disclosure describes and tests the effect of eight different Triply Periodic Minimal Surface Lattice Structures as interior structures 108 made from additive manufacturing on the power output and mechanical properties of the thermogalvanic brick with aqueous copper sulphate electrolyte so as to meet ASTM standards for compression strength (ASTM C67).

Thermogalvanic cells 107 are mainly characterized by their Seebeck coefficients ($\alpha$) and the maximum power output ($P_{max}$) of the cells, as further discussed below.

As discussed earlier, the Seebeck coefficient ($\alpha$) is a property which relates the temperature difference to the electrode potential of thermogalvanic cell 107 and has a quadratic effect on the cell's performance. For a hypothetical redox reaction:

$$A+ne^- \rightleftharpoons B$$

The Seebeck coefficient is expressed as:

$$(\alpha) = \frac{\partial E}{\partial T} \cong \frac{S_B - S_A}{nF}$$

where E is representative of electric potential difference, T is representative of temperature (Kelvin), $S_A$ is representative of partial molar entropies of A, $S_B$ is representative of partial molar entropies of B, n is representative of the number of electrons in the redox reaction, and F is representative of the Faraday constant.

The maximum power output is the highest power measured. It is obtained by connecting the external resistance to the thermogalvanic cell 107. At maximum power output, the internal resistance of the thermogalvanic cell 107 is equal to that of the external resistance applied and the electric potential is half the open circuit voltage. Hence, from Ohm's law:

$$\text{Power output} = E.I = \frac{E^2}{R_{ext}}$$

$$P_{max} = \frac{E_{oc}^2}{4R_{int}}$$

One of the critical properties of thermogalvanic cells 107 are their resistances. Thermogalvanic cells 107 are made up of three resistances. These are; activation ($R_a$), ohmic ($R_\Omega$), and mass transport ($R_m$) resistances and together, they make up the internal resistance of the thermogalvanic cell 107:

$$R_{int} = R_a + R_\Omega + R_m$$

The ohmic resistance is mainly affected by the properties of the electrolyte 109 or ionic resistance:

$$R_\Omega = \frac{L}{A\sigma}$$

where L is representative of the inter-electrode spacing, $\sigma$ is representative of the ionic conductivity of the electrolyte 109, and A is the surface area of the electrode 106.

The activation resistance depends on the electron transfer reactions:

$$R_a = \frac{RF}{AnFj_o}$$

where R is representative of the universal gas constant, T is representative of the absolute temperature in Kelvin, A is representative of the surface area of the electrode 109, n is representative of the number of electrons involved in the reaction, F is representative of the Faraday constant, and $j_o$ is the exchange current density.

For mass transport (Rm) resistance, it depends on the mass transport process of the electrolyte 109 and its physical state. It can be derived by subtracting the other two resistances from the internal resistance:

$$R_m = R_{int} - R_a - R_\Omega.$$

The internal resistance of the cell affects it power conversion efficiency by the relation expressed below:

$$\eta = \frac{\alpha^2 R_{th} \Delta T}{4 R_{int}}$$

where $R_{th}$ is the thermal resistance. The relation above shows that for higher cell efficiency, the thermal resistance must be increased and the internal resistance must be reduced.

A selective permeable membrane in the form of an interior structure 108 may be interposed into a thermogalvanic cell 107. This permeable membrane interior structure 108 allows the movement of ions but restricts thermal conductivity. This is to say that with the right material and structure, the performance of the thermogalvanic cell 107 can be increased.

Figure 7:
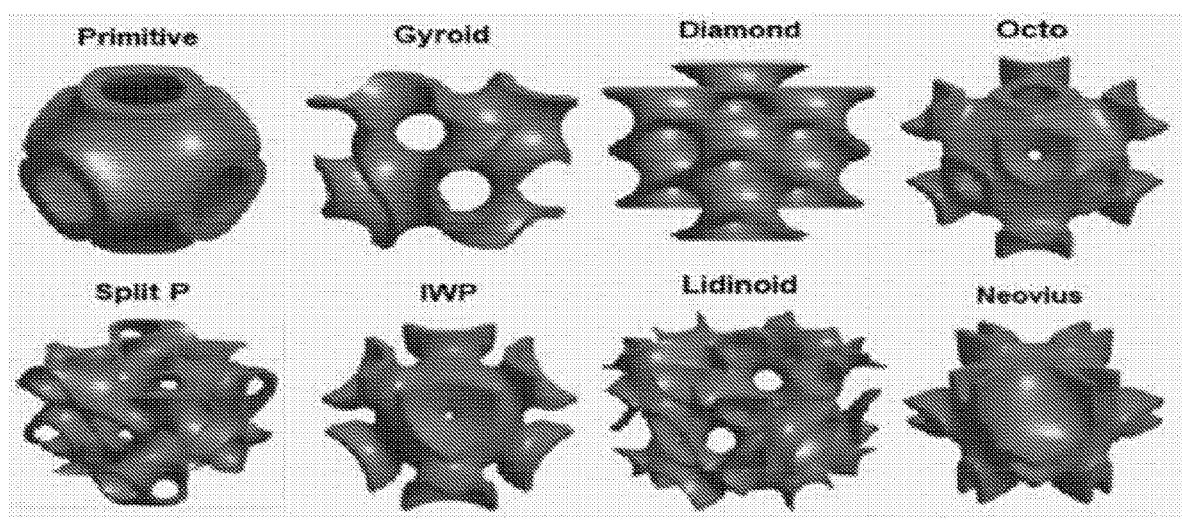
FIG. 7 shows 3D representations of eight Triply Periodic Minimal Surface (TPMS) structure configurations.
Figure 8A:
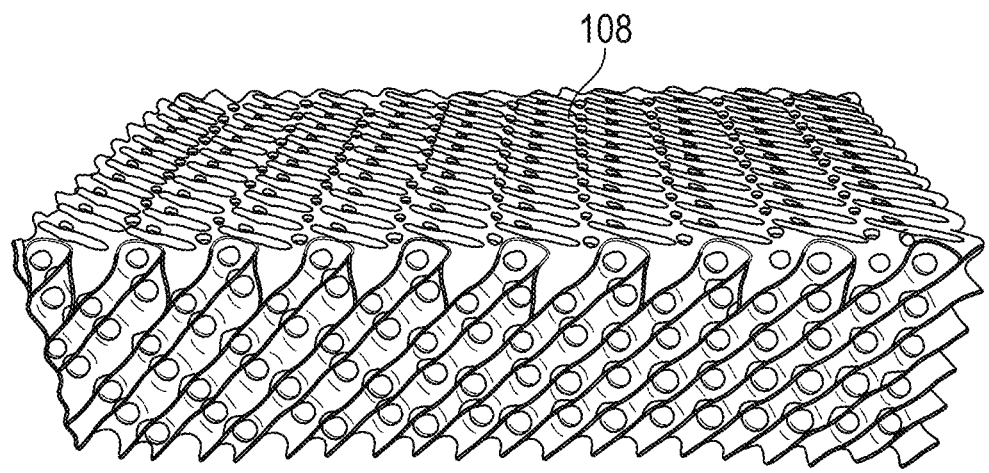
FIGS. 8A-8H are photographs of eight printed brick interiors with each brick interior configured using one of the eight TPMS structures (Schwarz D, Gyroid, Schwarz P, Neovius, Octo, Lidinoid, IWP, and Split P, respectively).
Figure 8B:
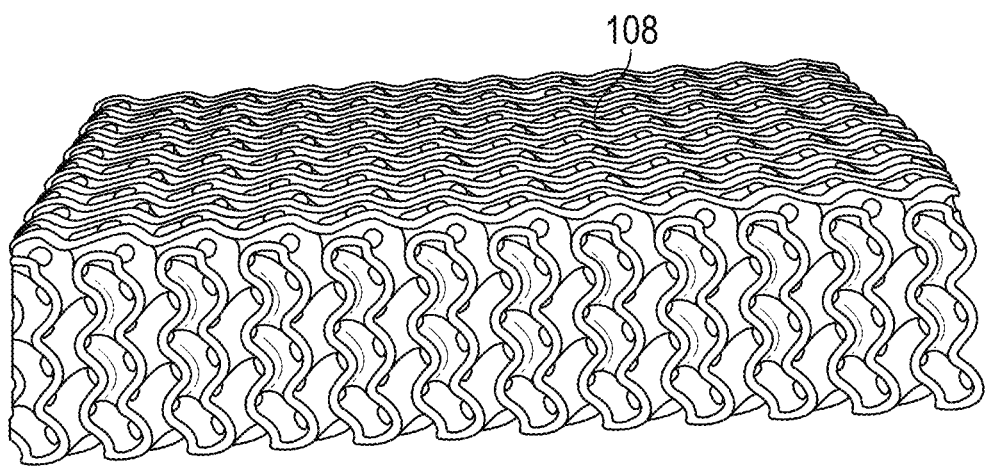
Figure 8C:
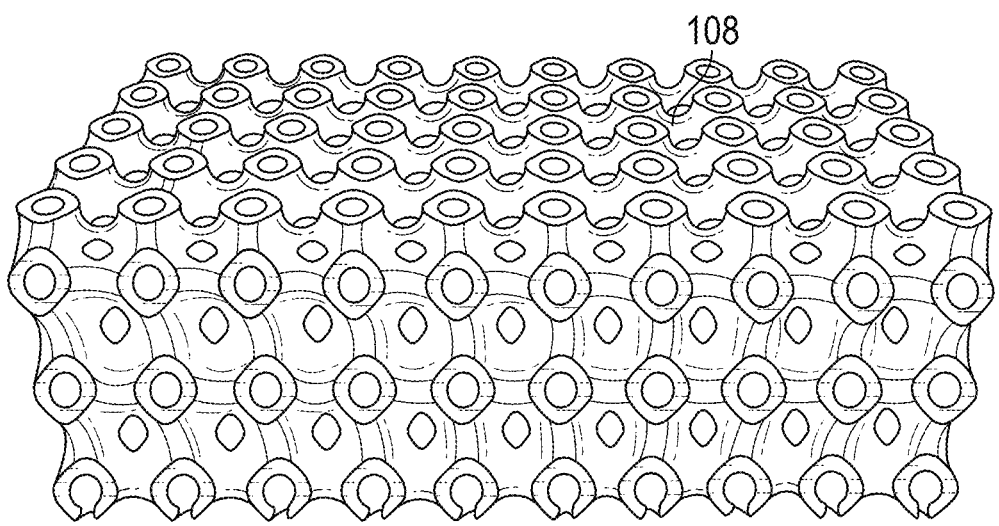
Figure 8D:
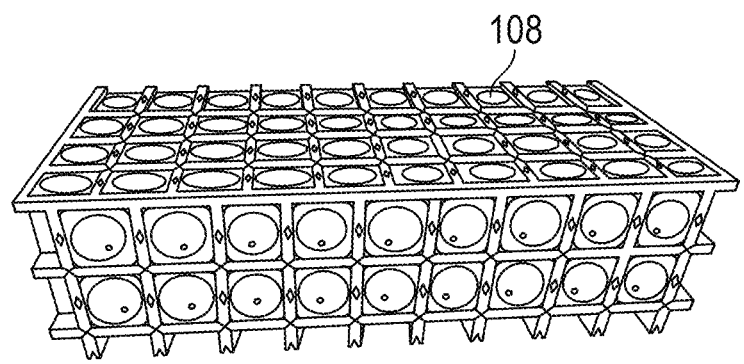
Figure 8E:
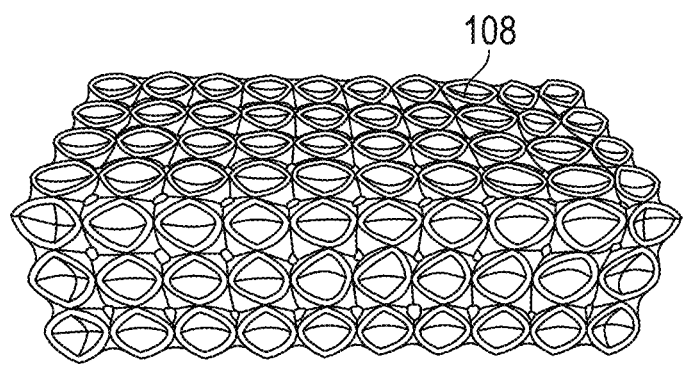
Figure 8F:
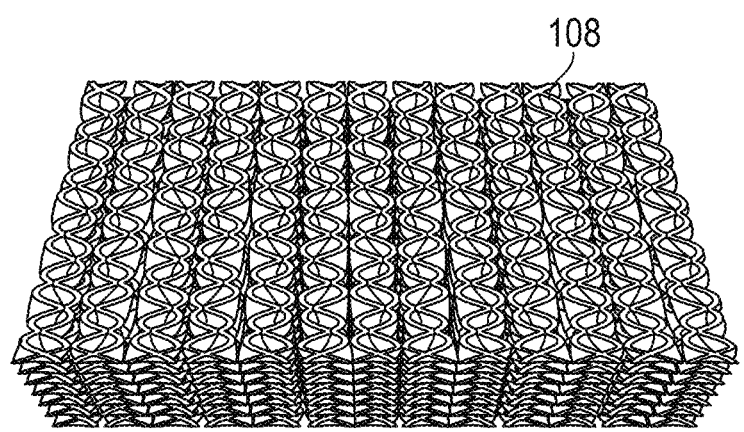
Figure 8G:
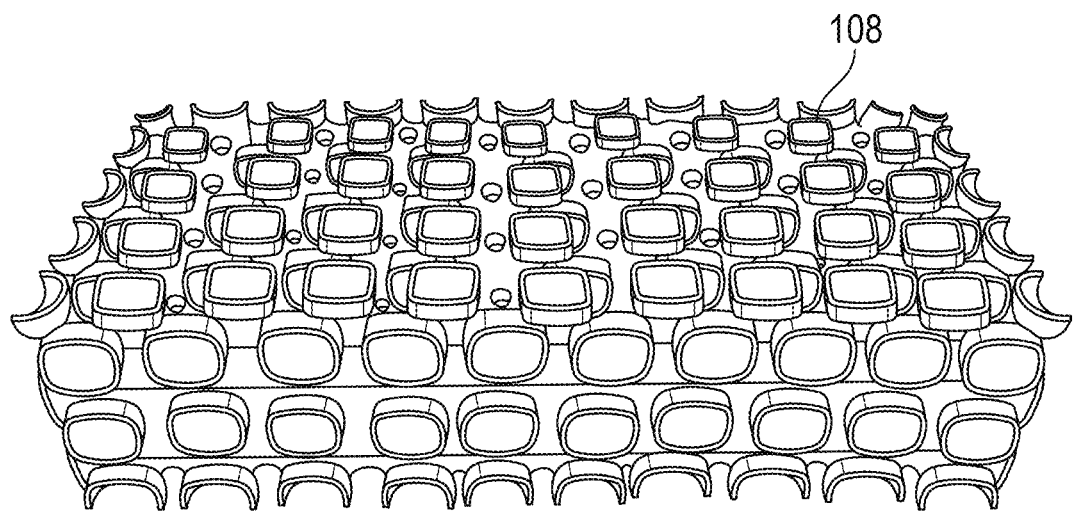
Figure 8H:
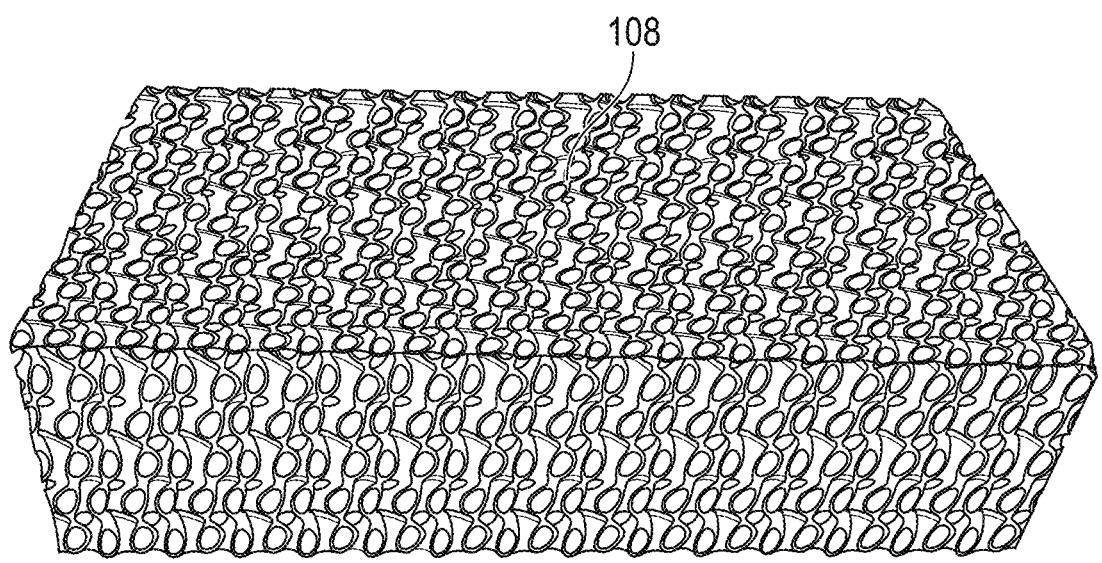

The endless design possibilities of additive manufacturing have made way for the implementation of cellular structures in modern designs. Their unique lightweight and energy absorbing capabilities make their applications limitless. Notable among these is a family of cellular structures known as Triply Periodic Minimal Surface Structures (TPMS), eight of which are shown in FIG. 7. They are believed to be the ideal geometries which mimic biomorphic geometries of human bones and other natural and pathological geometries but due to their high complexities, can only be manufactured by 3D printing. However, their smooth surfaces and uniform radius of curvature give them their self-supporting capabilities resulting in their high manufacturability. TPMS structures are lightweight and tend to have excellent impact absorption, strength to weight ratio, acoustic insulation and heat transfer properties which enable them to be employed in a wide range of applications.

Mathematically, triply periodic minimal surfaces are solutions to scalar-valued functions of three independent variables which are mostly thought of as the x, y, and z coordinates of a point in three-dimensional Euclidean space. Below are the equations of all eight minimal surfaces Gyriod, Schwarz D, Neovius, Schwarz P, Lidinoid, IWP, Split P, and Octo. A set of trigonometric functions which define each structure is given below:

Gyroid: $\cos x \sin y + \cos y \sin z + \cos z \sin x = t$

Schwarz D: $\sin x \sin y \sin z + \sin x \cos y \cos z + \cos x \sin y \cos z - \cos x \cos y \sin z = t$ Neovius: $3(\cos x + \cos y + \cos z) + 4(\cos x \cos y \cos z) = t$ Schwarz P: $\cos x + \cos y + \cos z = t$ Lidinoid: $0.15(\sin 2x \cos y \sin z + \sin 2y \cos z \sin x + 2z \cos x \sin y) - 0.5(\cos 2x \cos 2y + \cos 2y \cos 2z + \cos 2z \cos 2x) = t$ IWP: $\cos x \cos y + \cos y \cos z + \cos z \cos x - \cos x \cos y \cos z = t$ Split P: $1.1(\sin 2x \cos y \sin z + \sin 2y \cos z \sin x + \sin 2z \cos x \sin y) - 0.2(\cos 2x \cos 2y + \cos 2y \cos 2z + \cos 2z \cos 2x) - 0.4(\cos 2y + \cos 2z + \cos 2x) = t$ Octo: $4(\cos x \cos y + \cos y \cos z + \cos z \cos x) - 2.8(\cos x \cos y \cos z) + (\cos x + \cos y \cos z) + 1.5 = t$ As mathematical structures, TPMS structures are typically designed using mathematical modeling tools like MathMod or Wolfram Mathematica with their respective mathematical equations expressed above. However, it is difficult to create high quality structures and smooth surfaces from these softwares due to a lack of proper discretization as a result from inadequate number of nodes during modeling.

To overcome these limitations, a software known as Flatt Pack was used to model these structures. The software was used to generate stereolithography files which were later 3D printed. With Flatt Pack, blocks of dimension 199 mm×88.8 mm×52.3 mm blocks of all eight different internal structures 108 were generated at a volume fraction of 0.3 and respective number of cells across each axis as shown below in Table 1. The printed internal structures 108 are shown in FIGS. 8A-8H. While Flatt Pack was used to model some embodiments, any suitable modeling tool may be used.

TABLE 1

Dimension and cells of 3D printed TPMS structures

|  | X | Y | Z |
| --- | --- | --- | --- |
| Dimension (mm) | 199 mm | 88.8 mm | 52.3 mm |
| No. Cell | 9.95 | 4.44 | 2.615 |

The general class of cellular structures can be fabricated through polymer foaming processes using either physical or chemical blowing agents. However, these processes tend to generate random structures. The emergence of additive manufacturing has created the opportunity to manufacture these TPMS internal structures 108, offering outstanding control over the structures' architecture and periodic characteristics. For this research, the internal structures 108 were 3D printed by Fused Deposition Modeling (FDM) process using a Zortrax M200 3D printer and Z-ULTRAT material. Each internal structure 108 was printed at a layer height of 0.29, 100% infill and without support.

Figure 9:
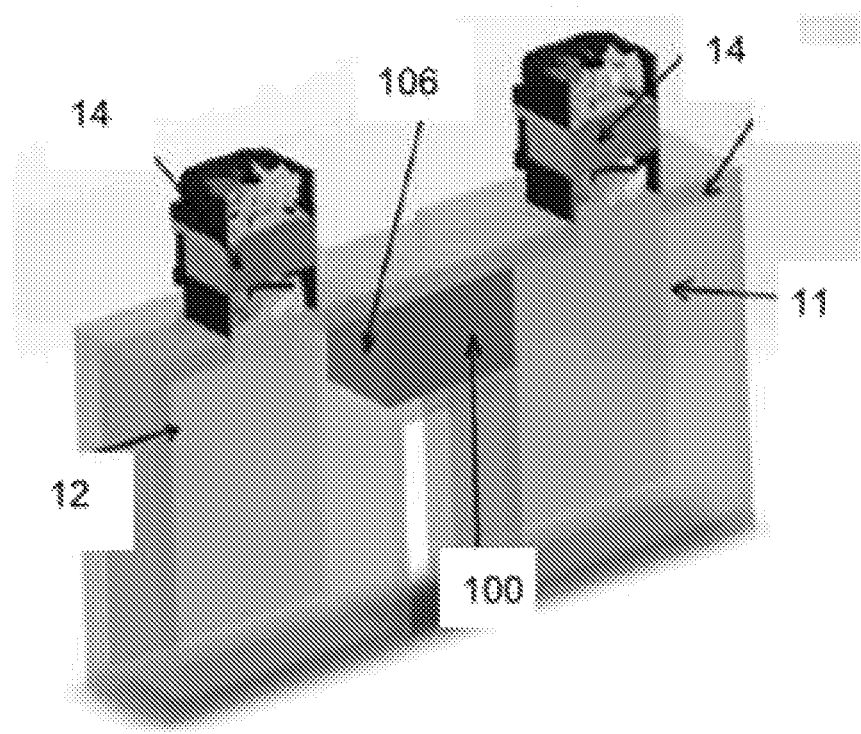
FIG. 9 is a CAD representation of the experimental setup for testing of each of the eight printed brick interiors of FIGS. 8A-8H.

For testing purposes, the experimental setup 10 is shown in FIG. 9 and is comprised of a thermogalvanic brick 100, PID controllers 15, a power supply 16, a Fluke multimeter 18, a variable resistor box 13 and an NI DAQ 17. This setup mimics the internal and external temperature conditions of a building, using a hot chamber 11 to model external conditions and a cold chamber 12 to model internal conditions.

For this experiment, 0.7 M $CuSO_4$+0.1 M $H_2SO_4$ was used for the electrolyte 109. The electrolyte 109 was formulated in batches of 500 mL each using almost a liter for each round of experimention. This was done with Copper sulfate pentahydrate (blue powder/crystals), sulfuric acid, de-ionized water, beakers, measuring cylinders and a measuring scale. Below shows the steps in preparing the electrolyte 109:

1. Measure out the correct amount of copper sulfate pentahydrate on the mass scale.
    a. For 500 mL final volume, the total is 87.39 g. I usually distribute this evenly into two beakers, eg 44.00 g+43.39 g.
2. Pour the copper sulfate pentahydrate into the large beakers and fill to roughly 80% of final volume, each with DI water.
    a. Each beaker: fill to 200 mL.
3. Place one beaker at a time on the magnetic stir plate and stir at least medium speed for 5 minutes or until the crystals dissolve.
4. Place the small beaker on the scale, then tare the scale.

5. Carefully measure out the correct amount of sulfuric acid into the small beaker
   a. For 500 mL final volume, the total is 4.90 g.
6. Carefully pour the acid into one of the large beakers having aqueous copper sulfate
7. Rinse the small beaker with ~10 mL of DI water and drain that into the large beaker as well
8. Stir the beaker having acid for ~1 minute.
9. One beaker at a time, pour the aqueous copper sulfate into the graduated cylinder. Add water to top off at the correct volume. Measure from the bottom of the meniscus.
   a. For 500 mL final volume, each beaker should contribute 250 mL.
10. Pour the solution from the graduated cylinder into one large beaker.
11. Label the beaker and cover with parafilm, or transfer to jar for longer storage.
12. At this point, the solution is often cloudy, possibly due to incompletely dissolved crystals if the solution is near the solubility limit. Stir the beaker until the solution shows no more opacity. This may take several hours.

Figure 10:
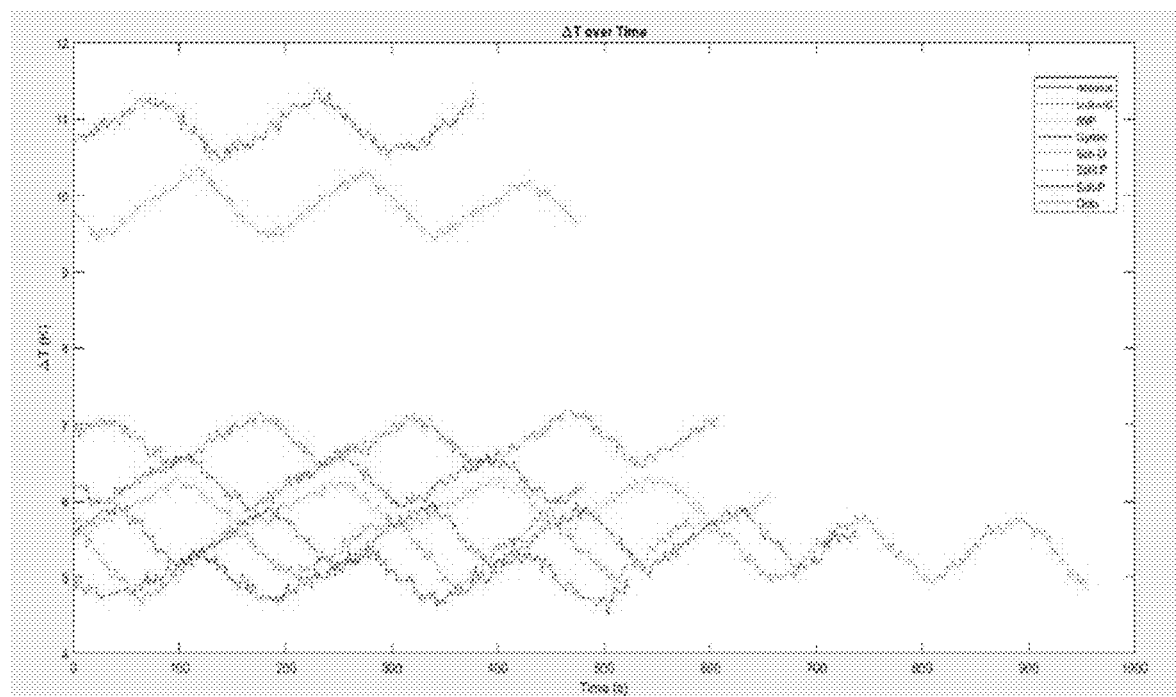
FIG. 10 is a graphical representation of a measured change in temperature (K) over time for each of the eight printed TPMS brick interiors.
Figure 11:
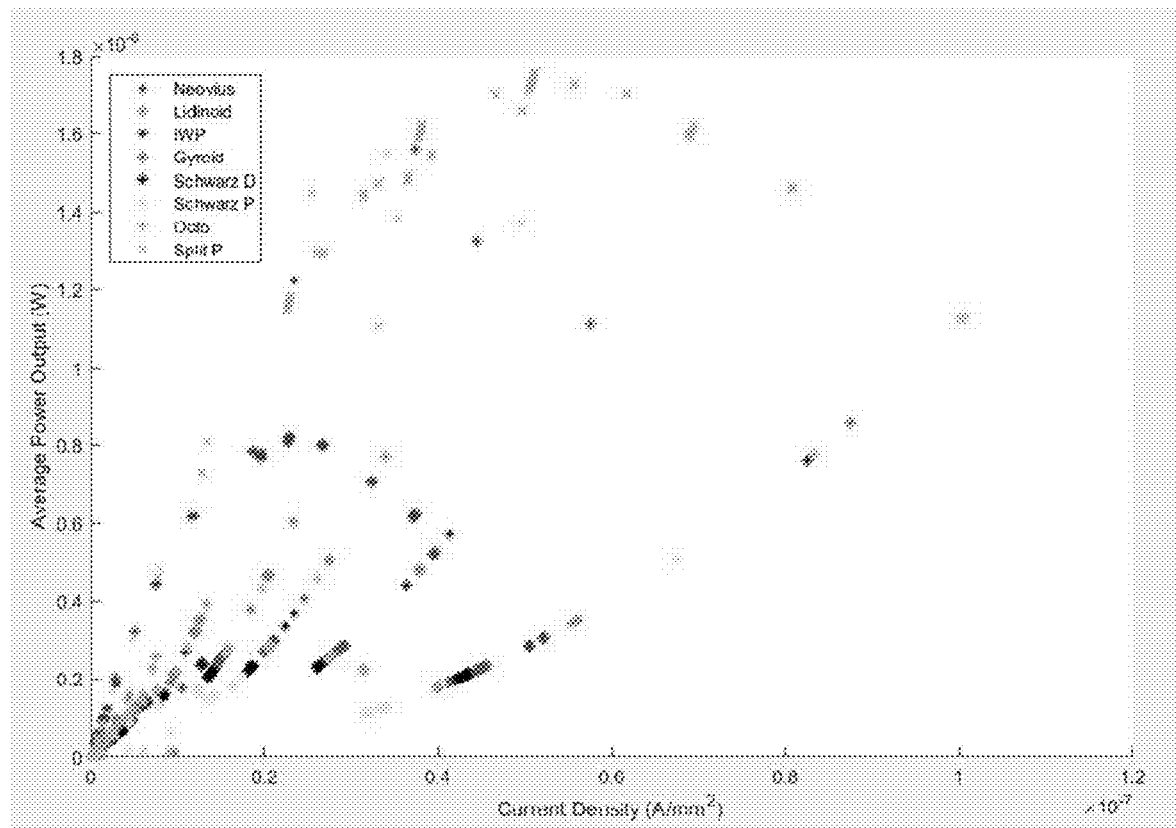
FIG. 11 is a graphical scatter plot representation of measured power output and measured current density of the eight printed TPMS brick interiors.

The TPMS interior structure 108 was placed in between the electrodes 106 and filled with the electrolyte 109 to create the thermogalvanic brick 100. The thermogalvanic brick 100 is then placed in the enclosure between the hot chamber 11 and the cold chamber 12. A plurality of thermocouples (not shown) are then attached to the hot and cold sides of the thermogalvanic brick 100—six thermocouples in all; three for each side. The thermogalvanic brick 100 was then covered and the remaining sides 103, 104 and 105 were insulated. The enclosure was then closed and the edges insulated with tape. A set of TECs 14 were then turned on and after 2 undisturbed hours the system reached steady-state. Data was recorded with the aid of a LabVIEW VI program which recorded a sample of cell potential per second and sampled the temperature measurements at 100 samples a second. The recording was started as the external resistances were varied from 1-20000 using the variable resistor box 13. Temperatures and voltages were recorded. The interior structure 108 and electrolyte 109 were changed, and the electrodes 106 sanded and cleaned with isopropyl alcohol. This process was repeated for each of the different Triply Periodic Minimal Surface interior structures 108. A graphical representation of a measured change in temperature over time associated with each of the eight TPMS interior structures 108 is shown in FIG. 10, and a scatter plot showing average power output and current density for thermogalvanic bricks 100 associated with each of the eight TPMS interior structures 108 is shown in FIG. 11.

Figure 12:
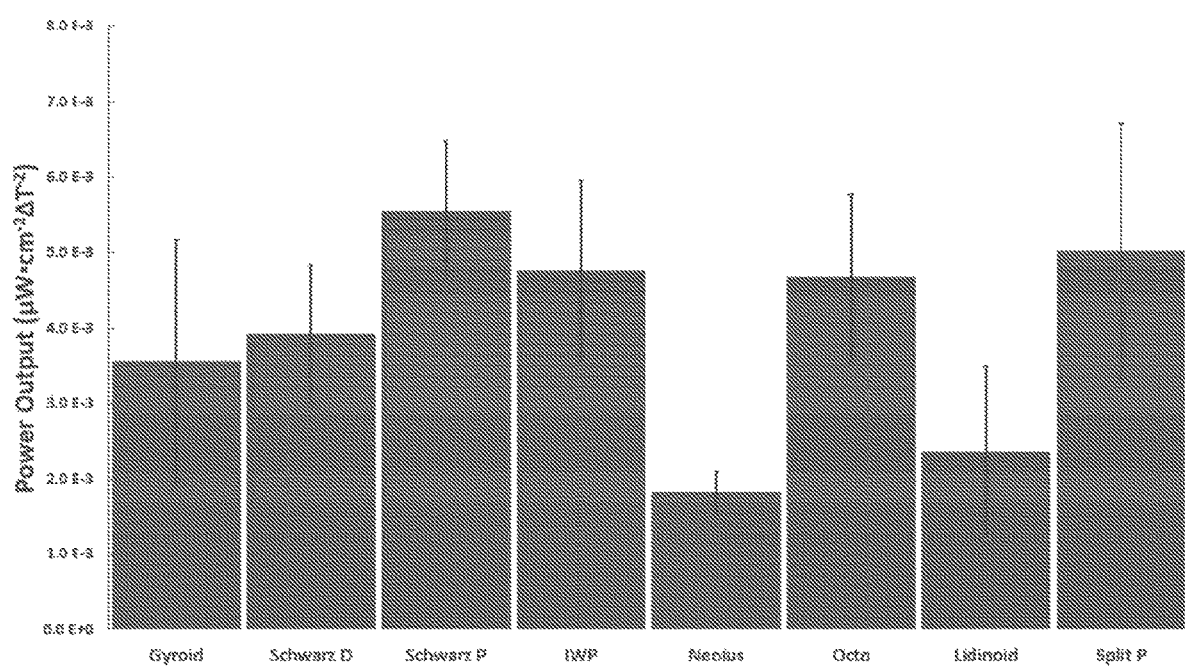
FIG. 12 is a graphical representation of measured power density for each of the eight printed TPMS brick interiors.

It can be observed from the results of FIG. 12 that, first, different triply periodic minimal surface interior structures 108 have effect on power output of the thermogalvanic brick 100. Secondly, it is seen that the Split P TPMS structure gave the highest nominal power density at about $5 \times 10^{-4}$ $\mu W/cm^2 K^2$ followed by Lidinoid at about $3.255 \times 10^{-4}$ $\mu W/cm^2 K^2$.

Figure 13A:
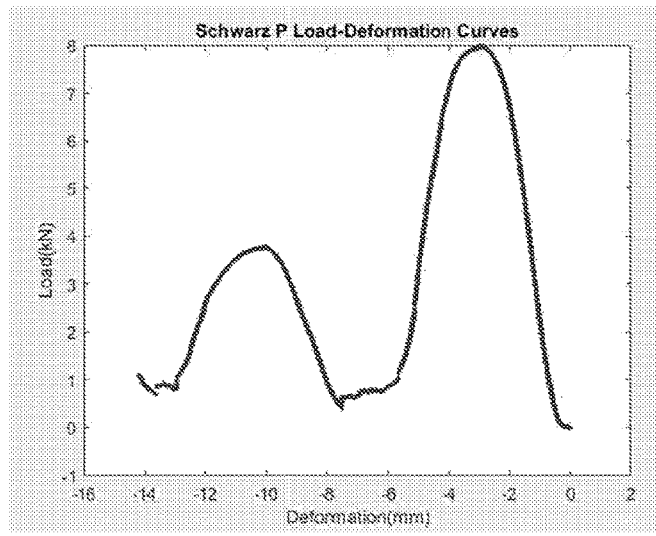
FIG. 13A is a graphical representation of a load-deformation curve associated with the Schwarz P TPMS structure.
Figure 13B:
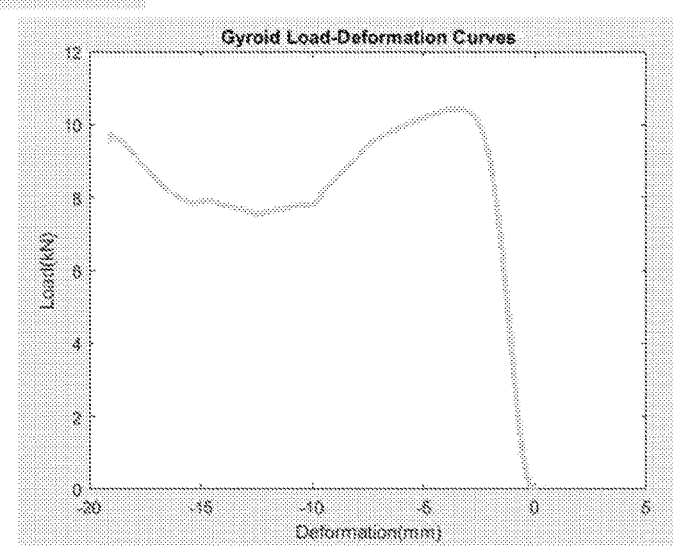
FIG. 13B is a graphical representation of a load-deformation curve associated with the Gyroid TPMS structure.
Figure 13C:
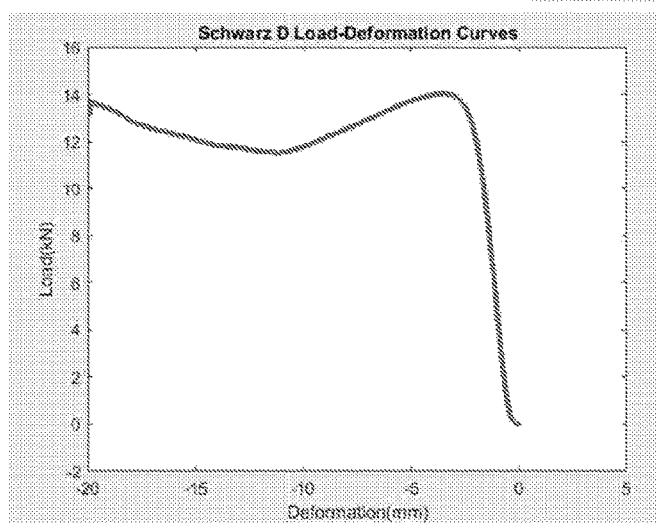
FIG. 13C is a graphical representation of a load-deformation curve associated with the Schwarz D TPMS structure.

To study the mechanical properties of the TPMS interior structures 108, samples of 40 mm×40 mm×40 mm were printed and tested. The material used was Z-ULTRAT from Zortrax. It has a Young modulus of 857 MPa and Poisson's ratio of 0.35. Samples were tested for compressive strength on Instron Compression Load frame and at 0.25 mm/s loading rate as per other literature. The loading was perpendicular to the plates. Results are shown in FIGS. 13A-13C for Schwarz P, Gyroid, and Schwarz D, respectively.

It is observed that Schwarz D and Gyroid showed a similar stress-strain behavior characterized by a short linear region. The two types of curves obtained shows that TPMS internal structures 108 could be used as both restorable and non-restorable energy absorbers and protective systems to replace most of current designs and might be more effective than conventional honeycombs and other cellular structures. It is recommended to use Schwarz D and Gyroid for applications requiring high stiffness and strain before failure and Schwarz P for low strain. Hence, it would be advisable to use Schwarz D or Gyroid for thermogalvanic brick 100 applications among the TPMS internal structure 108; however, other embodiments may include any other TPMS or lattice internal structure 108.

Figure 14:
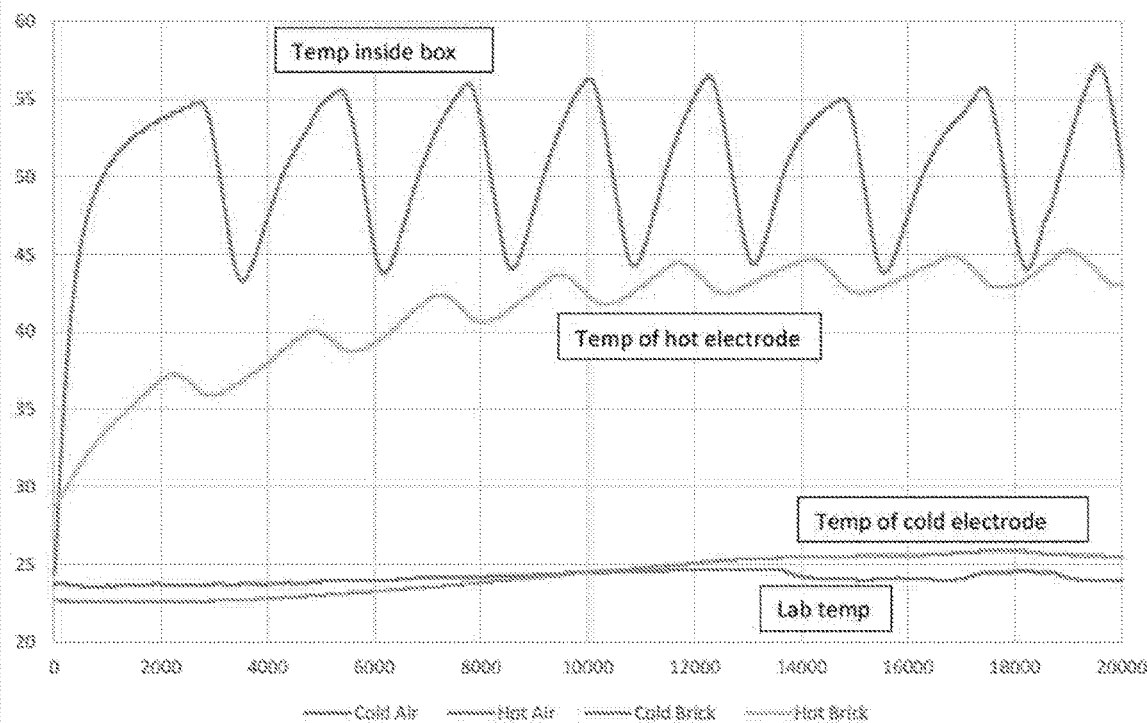
FIG. 14 shows graphical representations of temperatures over time using Perspex Brick and Wish Graphite based on cold air, hot air, cold brick, and hot brick.
Figure 14:
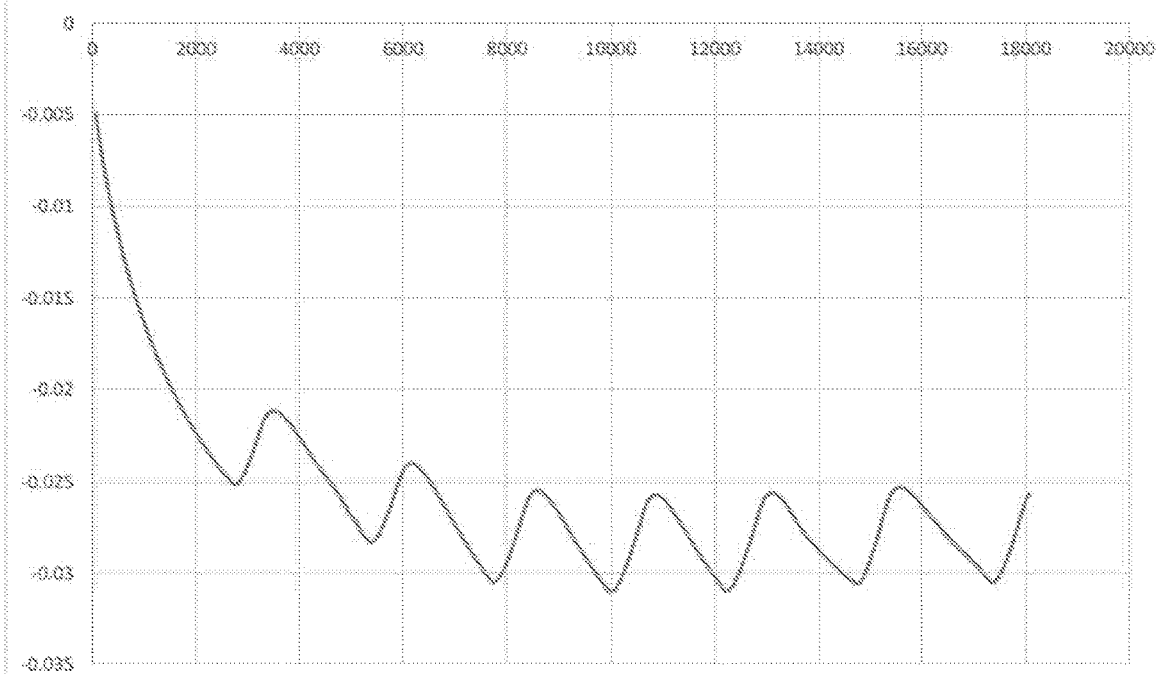
Figure 15:
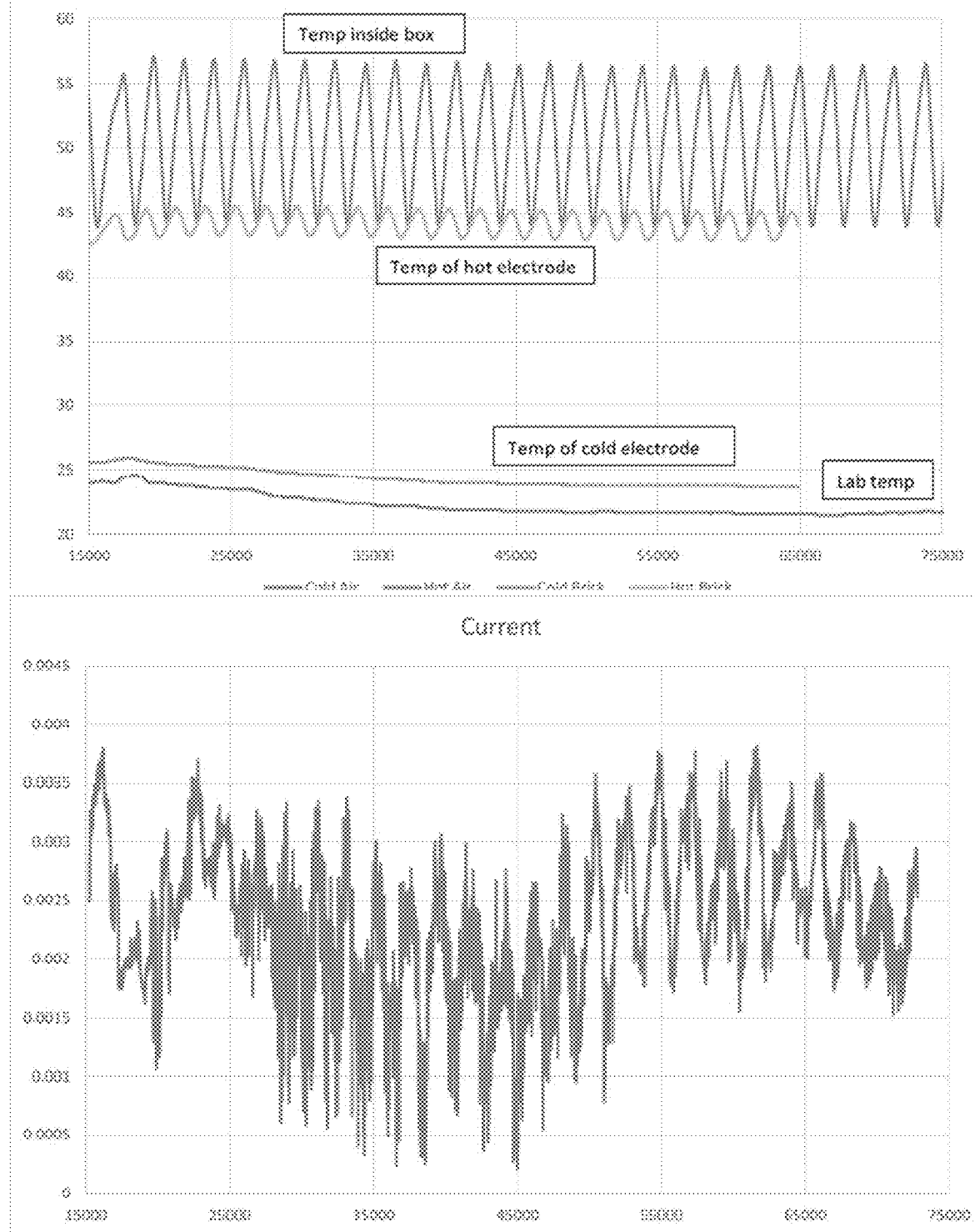
FIG. 15 shows graphical representations of temperatures over time using Perspex Brick and Wish Graphite based on cold air, hot air, cold brick, and hot brick.
Figure 16:
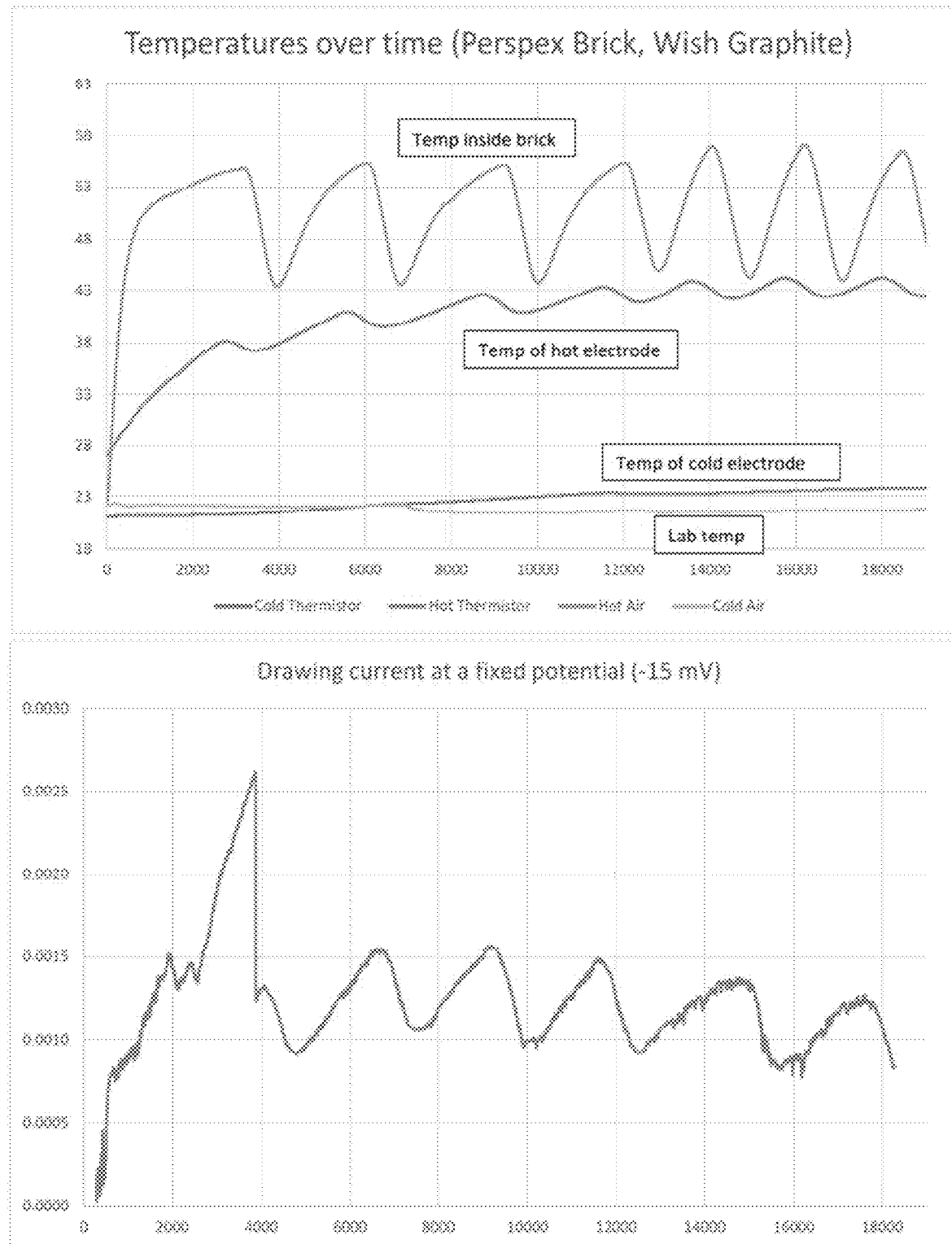
FIG. 16 shows graphical representations of temperatures over time using Perspex Brick and Wish Graphite based on cold thermistor, hot thermistor, hot air, and cold air.
Figure 17:
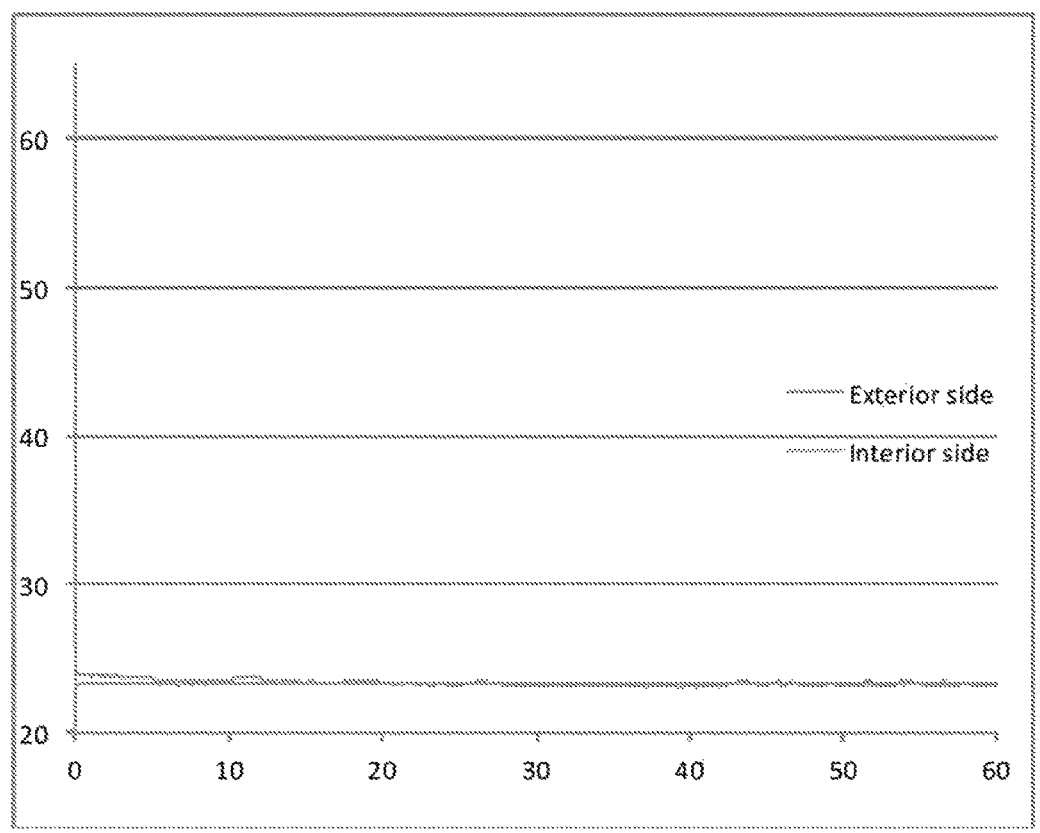
FIG. 17 is a graphical representation of a background measurement of a thermogalvanic brick.
Figure 18:
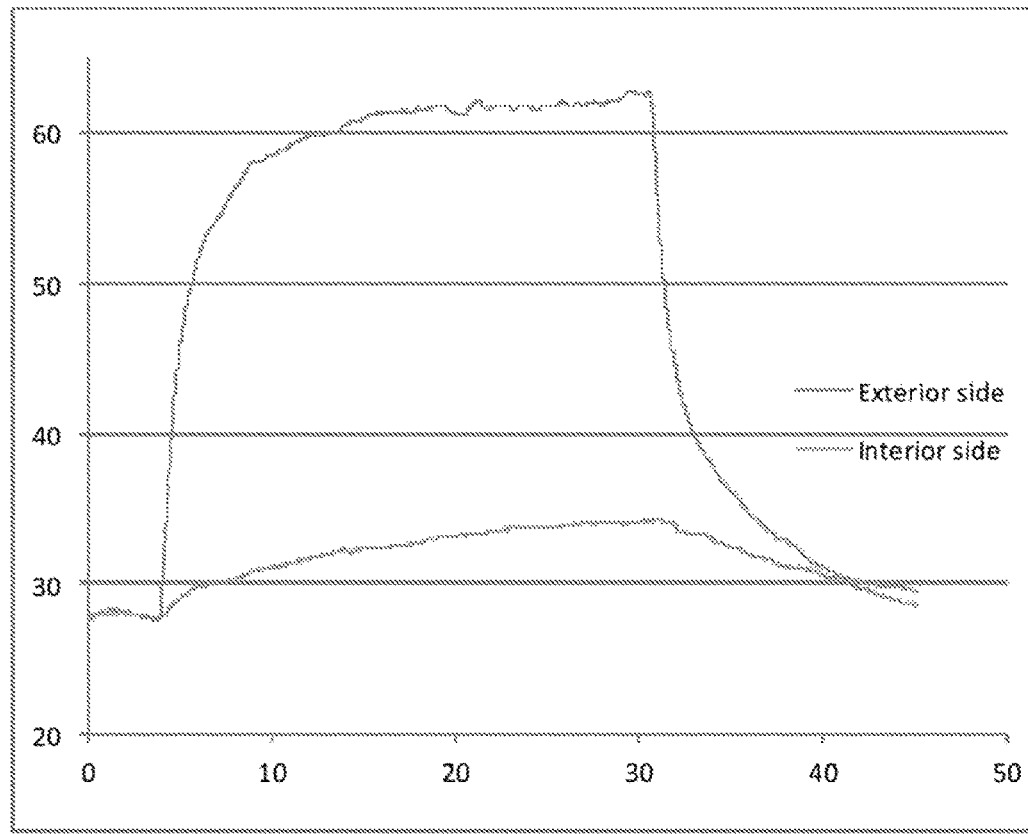
FIG. 18 is a graphical representation of test results of a thermogalvanic brick filled with air.
Figure 19:
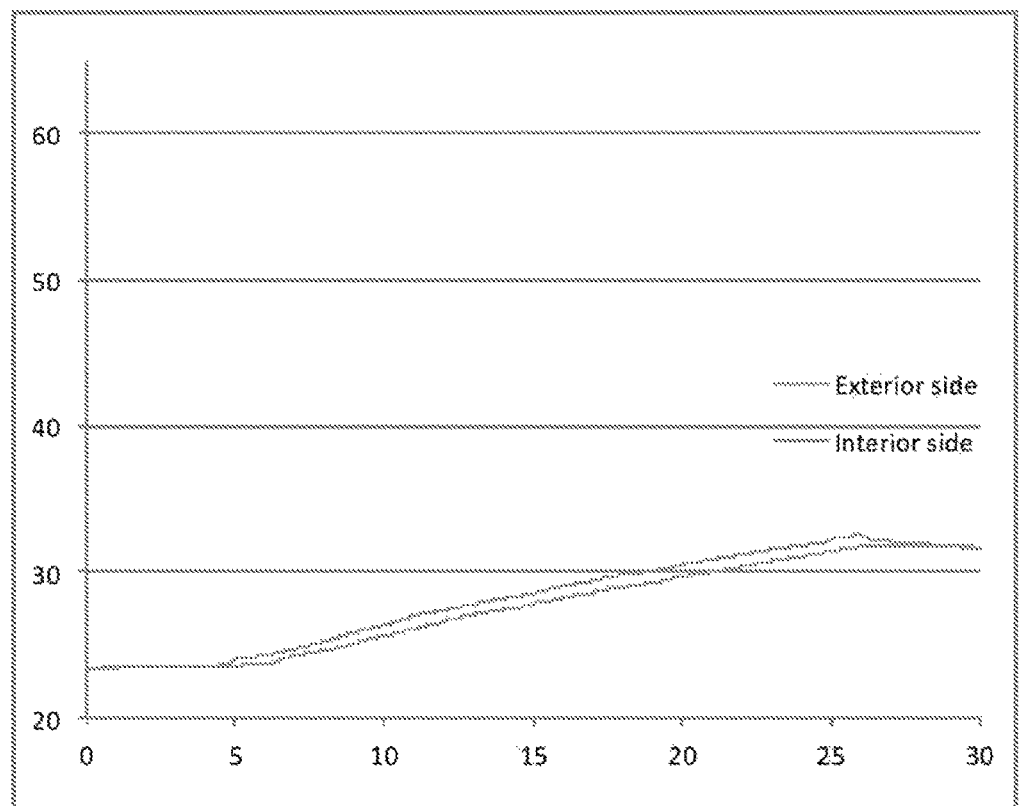
FIG. 19 is a graphical representation of test results of a thermogalvanic brick filled with water.
Figure 20:
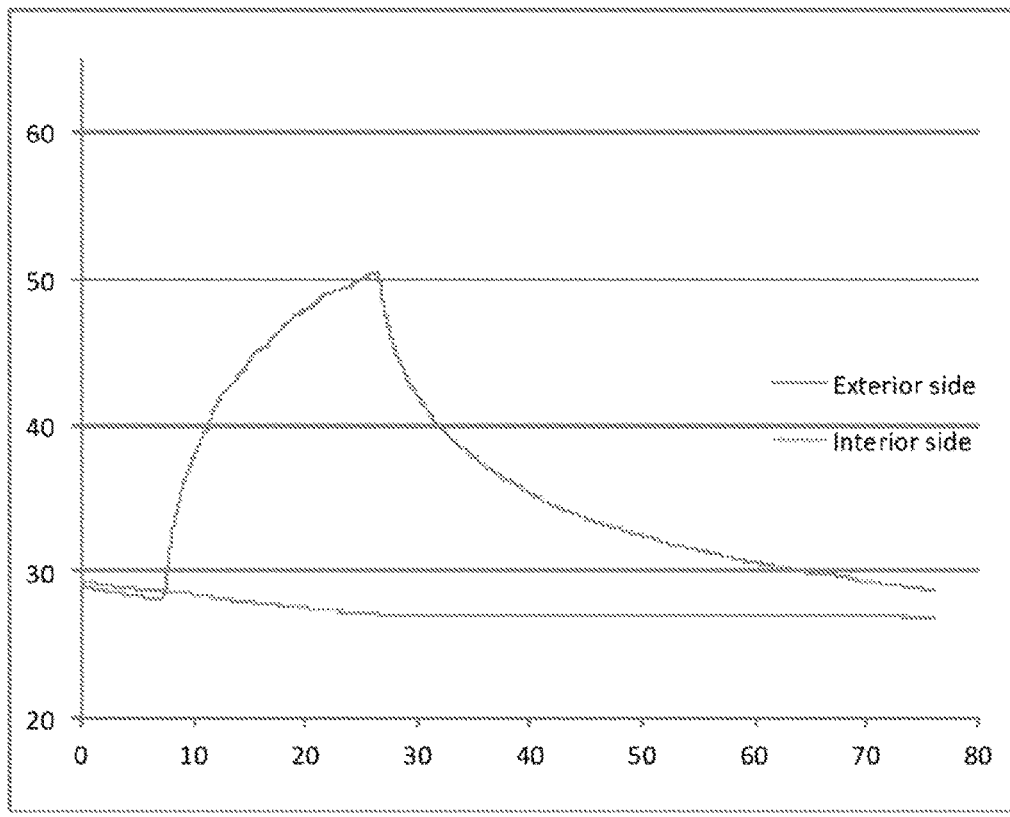
FIG. 20 is a graphical representation of test results of a thermogalvanic brick filled with gel.

FIGS. 14-16 are graphical representations showing potential measurements and current measurements related to the development of the thermogalvanic brick 100. FIG. 17 is a graphical representation showing background measurement of the thermogalvanic brick 100 during testing, FIG. 18 is a graphical representation showing test results of the thermogalvanic brick 100 filled with air, FIG. 19 is a graphical representation of test results showing the thermogalvanic brick 100 filled with water, and FIG. 20 is a graphical representation of test results showing the thermogalvanic brick 100 filled with gel. Initial testing shows that the thermogalvanic brick 100 with a black painted outer surface is capable of reaching 30° C. higher exterior temperatures than a shaded 'brick' 100 (e.g. ~50° C. in a 20° C. ambient), even when the interior temperature is held at a constant ~0° C.

This disclosure is extended to what is conventionally accepted as a 'brick', as in a regular feature which can be easily combined in order to construct features such as walls, and entire habitations. Furthermore, bricks are also now employed as purely cosmetic features, in order to improve the appearance of a construction. The term "brick" is used herein to cover such applications. Furthermore, the thermogalvanic brick 100 describes a regular feature consisting of the described exterior and interior components; if dimensions are altered these thermogalvanic bricks 100 could be employed in some embodiments as ceiling tiles; in other embodiments as flooring tiles. In other embodiments, brick dimensions may be chosen which are compatible with standard cinder block building materials. Therefore, the term "thermogalvanic brick" is employed as a generic term, but dimensions and applications in certain embodiments expand to cover a multitude of conventional construction applications. In addition, in some embodiments the internal structure 108 may be fabricated using many different types of plastics, including recycled plastic.

It is envisioned that such thermogalvanic bricks 100 may be useful in both developed markets (e.g., USA, UK, Australia, Europe, etc.) and in developing markets (e.g., sub-Saharan Africa, Southeast Asia, etc.). In developed economies where HVAC is the norm for buildings then the thermogalvanic bricks 100 will be converting artificially maintained temperature differences (between the inside and outside of buildings) to electric power, but importantly without increasing the HVAC load. In developing economies where HVAC systems may not be present, the thermogalvanic bricks 100 will exploit naturally occurring temperature differences in buildings, such as across thick masonry walls, and across the ceiling between the occupied space and the attic. The economic break-even points for the thermogalvanic brick 100 design will likely depend on the target markets, such that more expensive and efficient thermogalvanic bricks 100 may be suitable for developed markets, and less expensive and less thermogalvanic efficient bricks 100 more suitable for developing markets.

It should be understood from the foregoing that, while particular embodiments have been illustrated and described, various modifications can be made thereto without departing from the spirit and scope of the invention as will be apparent to those skilled in the art. Such changes and modifications are within the scope and teachings of this invention as defined in the claims appended hereto.

What is claimed is:

1. A thermogalvanic brick comprising:
   an outer casing defining an interior surface and exterior surface forming an enclosure;
   an all-plastic three-dimensional interior structure disposed within the outer casing and immersed in an electrolyte, wherein the three dimensional interior structure defines a lattice configuration and wherein the three dimensional interior structure is load-bearing; and
   a first electrode and a second electrode disposed on opposite sides of the three-dimensional interior structure;
   wherein a potential difference is induced between the first electrode and the second electrode when a temperature difference is present between the first electrode and the second electrode.

2. The thermogalvanic brick of claim 1, further comprising:
   a USB port in communication with the outer casing, wherein the USB port is in operative communication with the three-dimensional interior structure for providing an output of power generated by the three-dimensional interior structure.

3. The thermogalvanic brick of claim 1, wherein the lattice configuration comprises a triply periodic minimal surface configuration.

4. The thermogalvanic brick of claim 1, wherein the three-dimensional interior structure is immersed in a gelled or liquid electrolyte.

5. The thermogalvanic brick of claim 1, wherein the outer casing comprises a plastic material.

6. The thermogalvanic brick of claim 1, wherein exterior solar heating of the thermogalvanic brick has a controlled solar absorptivity, orientation, and shading to maximize the temperature difference between the exterior and interior surfaces of the thermogalvanic brick.

7. The thermogalvanic brick of claim 1, wherein the material of the three-dimensional interior structure is acrylonitrile butadiene styrene.

8. The thermogalvanic brick of claim 1, wherein the three-dimensional interior structure and electrolyte are thermally-insulating.

* * * * *